(12) United States Patent
Badenes et al.

(10) Patent No.: US 6,380,039 B2
(45) Date of Patent: *Apr. 30, 2002

(54) METHOD FOR FORMING A FET HAVING L-SHAPED INSULATING SPACERS

(75) Inventors: Goncal Badenes, Leuven; Ludo Deferm, Beverlo; Stephan Beckx; Serge Vanhaelemeersch, both of Leuven, all of (BE)

(73) Assignee: Interuniversitair Microelektronica Centrum (IMEC VZW), Leuven (BE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/283,709

(22) Filed: Apr. 1, 1999

Related U.S. Application Data

(60) Provisional application No. 60/084,445, filed on May 6, 1998, and provisional application No. 60/086,468, filed on May 22, 1998.

(51) Int. Cl.⁷ .............................................. H01L 21/336
(52) U.S. Cl. ........................................ 438/301; 438/303
(58) Field of Search ................................ 438/303, 300, 438/301, 304, 305, 306; 257/900

(56) References Cited

U.S. PATENT DOCUMENTS

| | | | |
|---|---|---|---|
| 5,094,712 A | 3/1992 | Becker et al. | 438/721 |
| 5,107,311 A | 4/1992 | Tsukamoto et al. | |
| 5,112,435 A | 5/1992 | Wang et al. | 216/49 |
| 5,150,176 A | 9/1992 | Schoenberg | |
| 5,250,837 A | 10/1993 | Sparks | |
| 5,290,720 A * | 3/1994 | Chen | 438/304 |
| 5,293,063 A | 3/1994 | Anceau | |
| 5,770,508 A * | 6/1998 | Yeh et al. | 438/305 |
| 5,783,475 A * | 7/1998 | Ramaswami | 438/303 |
| 5,898,203 A * | 4/1999 | Yoshitomi et al. | 257/344 |
| 5,914,519 A * | 6/1999 | Chou et al. | 257/410 |

FOREIGN PATENT DOCUMENTS

| | | |
|---|---|---|
| EP | 0 272 143 | 6/1988 |
| EP | 0 395 358 | 10/1990 |
| EP | 0 766 295 | 4/1997 |

OTHER PUBLICATIONS

Ehinger, et al.; "Narrow $BF_2$ Implanted Bases for 35 GHz / 24 ps High–Speed Si Bipolar Technology"; Proceedings of the International Electron Devices meeting, Washington; Dec. 12, 1991; pp. 91/459–462.

Ward, et al.; "A Highly Selective Anisotropic Nitride Etch Process Using $SF_6$ / HBr Chemistries"; Extended Abstracts; vol. 93/1, Jan. 1, 1993; p. 1261/1262.

Copy of European Search Report; Application No. 98 87 0064.

* cited by examiner

Primary Examiner—Olik Chaudhuri
Assistant Examiner—Hoai Pham
(74) Attorney, Agent, or Firm—Knobbe, Martens, Olson and Bear LLP

(57) ABSTRACT

A scaleable device concept and particularly a method for fabrication thereof is disclosed, which allows for a minimal well-controlled gate overlap by using low resistivity source/drain extension regions with shallow junctions. By using such shallow junctions, which are obtained using L-shaped spacers, the gate overlap is no longer dependent on the junction depth of the source/drain contact regions. Particularly the L-shaped spacers are used to locally reduce the penetration depth of the source/drain implantation in the substrate. This concept is particularly interesting for FET's having a channel length below 0.25 $\mu$m because this approach broadens the process window of the silicidation process of the source/drain contact regions. Moreover, the extension regions have to be subjected only to a limited thermal budget.

28 Claims, 1 Drawing Sheet

Figure 1
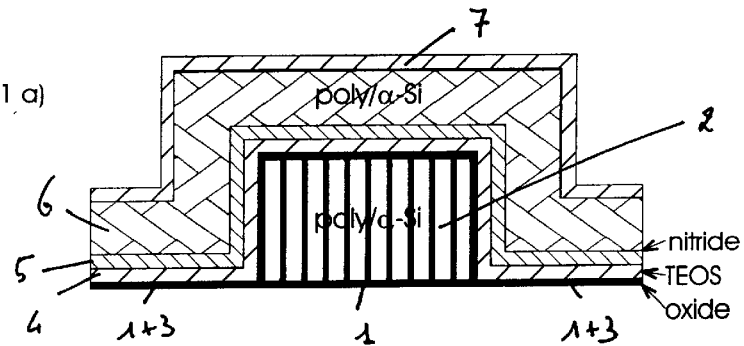
Fig.1 a)
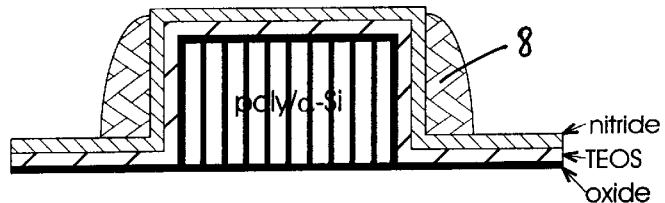
Fig.1 b)
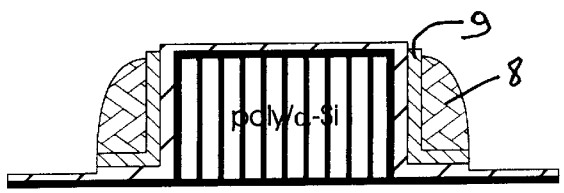
Fig.1 c)
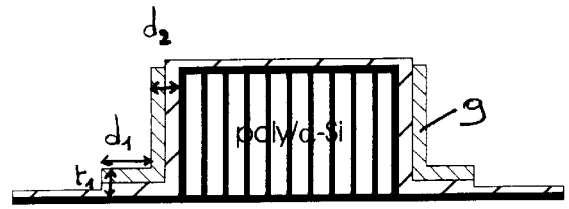
Fig.1 d)
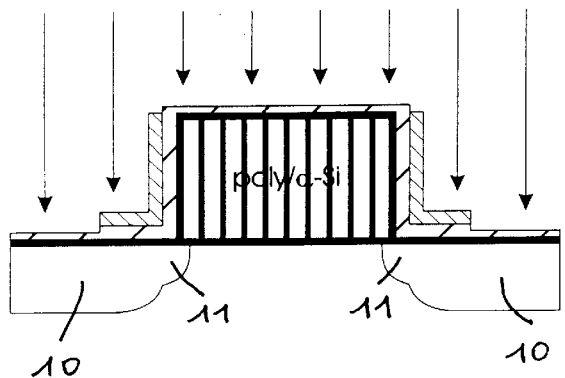
Fig.1 e)

METHOD FOR FORMING A FET HAVING L-SHAPED INSULATING SPACERS

This is a provisional of 60/084,445 filed May 6, 1998 which is a provisional of 60/086,468 filed May 22, 1998.

FIELD OF THE INVENTION

The present invention is related to the fabrication process of semiconductor devices, particularly field effect transistors (FET's) comprising L-shaped insulating spacers. These spacers are of particular interest for fabricating FET's with a sub 0.25 μm channel length.

BACKGROUND OF THE INVENTION

Insulating spacers are widely used in the process of manufacturing integrated circuits. These spacers are mainly used for two important applications namely to isolate two conductive patterns one from another and as masking elements. Especially if their sole function is their use as masking elements, disposable spacers are often used. Disposable spacers are spacers which are removed later on in the process. However, for quite a number of applications permanent spacers are used because both their function as insulating elements as well as masking element is required. Examples of such permanent spacers can be found, e.g. in a FET, particularly in a FET with a lightly doped drain (LDD) and/or source, where the spacers are located at the sidewalls of the gate and are used to isolate the gate from the drain and/or source as well as to serve as a masking elements for the implantation of the highly doped drain/source regions. The formation of the (permanent) spacers is a very critical part of the manufacturing process because this spacer formation has a large influence on the definition of the intrinsic device and therefore on the device characteristics. Because the dimensions of the intrinsic device are very small, i.e. typically in the deep sub-micron range, one has to be able to define these spacers in a very controllable and reproducible way in order to be able to meet the stringent yield and reliability specifications. This problem will even be more stringent in the future due to the ongoing downscaling of the device dimensions.

In the past so-called lightly doped drain devices (LDD devices) have been introduced mainly to guarantee the specified operation during lifetime for a given supply voltage. This can be accomplished due to the electrical field lowering effect of lightly doped extensions. The major problems of such devices are:

- establishing a well-defined and controllable overlap between the gate and the lightly doped source and drain extensions
- establishing a well-defined and controllable offset between the lightly doped extensions and the respective (highly) doped source/drain regions in order to achieve a less steep doping gradient as compared with devices without extensions and thus a lower electrical field.

Conventionally the solution proposed to solve the overlap problem was either by means of out-diffusion of the as implanted lightly doped extensions (which were implanted self-aligned to the gate), or by means of LATID, where an implant under a large tilt angle is performed. To define an (extra) offset between the extensions and the respective source/drain regions, spacers adjacent to the gate of the device were used, i.e. lightly doped extensions were implanted self-aligned to the gate before the spacer formation, while the highly doped regions were implanted using the spacer as a mask. In the latter case contrary to the dimensions of the spacer, the precise shape of the spacer is not that important regarding the functionality of the device as long as the spacer isolates the gate from the drain/source regions and blocks the highly doped source/drain implantation. Remark that this conventional method requires two separate implantation steps and lithographic steps in order to form the source/drain regions, i.e. the highly doped regions as well as the extensions. Furthermore because the LDD implantation to form the extensions is in such an early stage of the process, the extensions are subjected to a large thermal budget.

Concerning sub 0.25 μm CMOS and BiCMOS process generations, it is not likely that lightly doped extensions will still be required in field effect transistors in order to guarantee the specified operation during lifetime for a given supply voltage, due to the downscaling of the supply voltage. Hot carrier degradation is no longer a big issue, especially not for p-channel devices. However, the fabrication of shallow junctions, a low contact resistance to these junctions using silicide layers and a well defined and controllable gate overlap will be issues in these sub 0.25 μm devices. Particularly because in se in conventional device concepts shallow junctions and a stable, reliable silicidation process are difficult to combine often resulting in a very limited process window.

The U.S. Pat. No. 5,702,986 is related to a process of forming L-shaped spacers and a process of forming LDD FET's comprising such spacers. The L-shaped spacers are primarily introduced to limit mechanical stress. The spacer formation process of U.S. Pat. No. 5,702,986 is however a complicated process comprising dry and wet etching steps. Another disadvantage of this process is that the anisotropic spacer etch stops on/in the silicon substrate.

SUMMARY OF THE INVENTION

In an aspect of the invention, a scaleable device concept and a method for fabrication thereof is disclosed, which allows for a minimal well-controlled gate overlap by using low resistivity source/drain extension regions with shallow junctions. On the other hand, these new device concepts of the present invention facilitate the silicidation process because deeper source/drain contact regions can be used without influencing the gate overlap due to the fact that the gate overlap is defined by the extension regions and not by the source/drain contact regions. So, according to this aspect of the invention, a method for fabricating a field effect transistor on a substrate is disclosed, said substrate comprising at least one first part and at least one second part adjacent to said first part, said first part being covered with at least one first insulating layer and at least one conductive layer thereby forming a first area, i.e. e.g. the gate area of a FET, said second part being either uncovered or covered with said first insulating layer, thereby forming a second area, said method comprising the steps of:

a) forming a second insulating layer on said first and said second area, at least when said second part of said substrate is uncovered;

b) forming a third insulating layer on said second insulating layer or on said first and second area;

c) forming a disposable layer on said third insulating layer;

d) anisotropically etching said disposable layer using said third insulating layer as an etch stop layer to thereby form at least one spacer of said disposable layer on said second area adjacent to said first area;

e) removing said third insulating layer, using said spacer of said disposable layer as a mask;

f) removing said spacer of said disposable layer to thereby free the insulating spacer formed in said third insulating layer, said insulating spacer comprising a first portion being the base of said spacer, and a second portion, being the upright part of the insulating spacer adjacent to said first area; and g) performing a source/drain dopant implantation using said first portion of said insulating spacer as a an element to lower the penetration depth of said implantation in said substrate thereby assuring that substantially the entire implantation dose penetrates at least into the part of the substrate below said first portion of said spacer. In other words, at least the extension regions are defined. Preferably, the insulating spacer formed is "L"-shaped.

In an embodiment of the invention, prior to the source/drain implantation, the first and the second insulating layer are removed using the insulating spacer formed in the third insulating layer as a mask.

In another embodiment of the invention a method is disclosed wherein said disposable layer is a silicon layer, e.g. a polysilicon or an amorphous silicon layer and wherein eventually, prior to the dry etching of said silicon layer, i.e. step d), first a native oxide, formed during exposure of said substrate to an ambient comprising oxygen, is removed. Alternative said disposable layer is a silicon (di)oxide layer.

In another embodiment of the invention, a method for fabricating a field effect transistor on a substrate is disclosed, wherein said substrate is placed in a chamber of an etch tool, said chamber having an ambient comprising HBr or a mixture of HBr and $Cl_2$. Particularly in case step d) is performed, said ambient can further comprise a small amount of oxygen, i.e. typically less than 5%. Instead of a HBr—based chemistry also a fluorine based chemistry like e.g. $CF_4$, or $C_2F_6$, or any other dry etch chemistry suited to remove the disposable layer selectively, i.e. typically with a ratio of about 3:1 or higher, from said third insulating layer can be applied. In case step e) is performed, said ambient can further comprise a small amount of oxygen, i.e. typically less than 5%. Instead of a HBr—based chemistry also any other dry etch chemistry suited to remove said third insulating layer selectively, i.e. typically with a ratio of about 2:1 or higher, to said spacer of a disposable layer can be applied. In case step f) is performed, i.e. the removal of the spacer of the disposable layer, said ambient can further comprise He or a mixture of He and oxygen, or instead of a HBr—based chemistry also any other dry etch chemistry suited to remove the remaining of said spacer of the disposable layer and eventually other residues selectively to said second and said third insulating layer. During steps d), e) and f) the substrate is located in a chamber of an etch tool, said chamber having a controllable ambient and being pressurized at a value substantially below the atmospheric pressure, i.e. typically in the range between 1 and 100 mTorr. Steps d), e) and f) can be performed without breaking vacuum, i.e. without exposing said substrate to the air and more particularly without switching the pressure between said value substantially below the atmospheric pressure and a value of about the atmospheric pressure. This can be done in a single chamber of an etch tool, or at least in a chamber of a single etch tool.

In another embodiment of the invention, said substrate comprising said first and said second region is placed in a chamber of an etch tool after said second and said third insulating layer and said disposable layer are formed on said first and said second region of said substrate. Thereafter, said substrate in said chamber can be subjected to a single removal process comprising dry etching steps d), e) and f) without breaking vacuum in said chamber. Particularly, for the formation of the spacer, preferably said spacer is a L-shaped spacer of an insulating material, a removal process is developed wherein in one removal sequence the remaining spacer of the disposable layer is removed as well as said L-shaped spacer of an insulating material is formed. By doing so, the introduction of an extra removal step, after breaking vacuum, to remove the spacer of the disposable layer is avoided. According to this embodiment of the invention, dependent on the precise etch chemistry, steps d) and e) or steps e) and f) or steps d), e) and f) can be combined by adapting and/or adjusting the flow of the chemicals and the pressure in the chamber. In the latter case, the single removal process comprises only one anisotropic dry etching step.

In another embodiment of the invention, a method is disclosed for forming a spacer on a substrate wherein said first, said second and said third insulating layer are selected from the group consisting of silicon oxides, silicon nitrides and silicon oxynitrides. Particularly, when said spacer is a nitride spacer and so and said third insulating layer is a nitride layer, preferably said second insulating layer is an oxide layer.

In another embodiment of the invention said at least one layer of said first region can be a polysilicon layer or an amorphous silicon layer or a combination of one of the previous layers and a silicide layer.

Further according to the method of the present invention, the distance, $d_2$, being the sum of the width of the second insulating layer conformal to the side wall of the first region, i.e. the gate, and the width of the second portion of the insulating spacer, can be easily varied by varying the thickness of the second and/or the third insulating layer. Furthermore the width, $d_1$, of the first portion of the insulating spacer can also be varied independently by changing the thickness of the disposable layer. Moreover, the thickness, $t_1$, being at least the sum of the thickness of the first portion of the insulating spacer and the thickness of the insulating layers between said first portion and the underlying substrate, i.e. the second insulating layer or the first and the second insulating layer, can also easily be controlled by changing the thickness of the layer. In other words $t_1$ is greater than or equal to $d_2$. Therefore, dependent on the desired device performance, an insulating spacer with optimum dimensions can be formed to meet the performance specifications.

In another embodiment of the invention, the thickness, $t_1$, is chosen such that the penetration depth of the source/drain implantation in the substrate is lowered by the insulating spacer and the underlying insulating layer. By doing so, not only highly doped source/drain contact regions are created adjacent to the spacer, but also ultra shallow highly doped extensions are created underneath the spacer because substantially the complete implantation dose penetrates into the substrate below the first portion of the insulating spacer, i.e. at least below the part of said first portion of the insulating spacer which is not covered by the second portion of the insulating spacer. As a result the gate overlap can be kept very small and well defined because the gate overlap can be fine tuned by optimising $d_2$. Furthermore, on can also opt to perform an additional source/drain contact implantation after step d), i.e. after the formation of the disposable spacer, using the disposable spacer as a mask, potentially followed by a thermal treatment. By doing so, the source/drain regions are already formed and simultaneously in case a polysilicon or amorphous silicon gate is used, also the gate is doped.

In another aspect of the invention, a method for fabricating a field effect transistor on a substrate is disclosed, said substrate comprising at least one first part and at least one second part adjacent to said first part, said first part being covered with at least one first insulating layer and at least one conductive layer thereby forming a first area, said second part being either uncovered or covered with said first insulating layer, thereby forming a second area, said method comprising the steps of:

a) forming an oxide layer on said first and said second area, at least when said second part of said substrate is uncovered;

b) forming a nitride layer on said oxide layer or on said first and second area;

c) forming a disposable oxide layer on said nitride layer;

d) anisotropically etching said disposable oxide layer using said nitride layer as an etch stop layer to thereby form at least one spacer of said disposable oxide layer on said second area adjacent to said first area;

e) removing said nitride layer, using said spacer of said disposable layer as a mask to thereby define an insulating spacer in said nitride layer, said insulating spacer comprising a first portion being the base of said spacer, and a second portion, being the upright part of the insulating spacer adjacent to said first area;

f) removing said spacer of said disposable oxide layer and at least said oxide layer using said insulating spacer as a mask; and g) performing a source/drain dopant implantation using said first portion of said insulating spacer as an element to lower the energy of said implantation thereby assuring that substantially the entire implantation dose penetrates at least into the part of the substrate below said first portion of said spacer. Particularly the step of removing said spacer of said disposable oxide layer and of said first and second oxide layer using said insulating spacer as a mask is executed using a HF-based wet etch solution. In case said first insulating layer is a silicon (di)oxide layer this layer can be removed by means of the same HF-based wet etch solution using said insulating spacer as a mask.

BRIEF DESCRIPTION OF THE DRAWINGS

FIG. 1 depicts, according to an embodiment of the invention, a schematic process flow used to fabricate a field effect transistor.

DETAILED DESCRIPTION OF THE INVENTION

In relation to the appended drawings the present invention is described in detail in the sequel. It is apparent however that a person skilled in the art can imagine several other equivalent embodiments or other ways of executing the present invention, the spirit and scope of the present invention being limited only by the terms of the appended claims.

In a preferred embodiment of the invention, as an example (see FIG. 1), a method is disclosed for forming a field effect transistor on a substrate comprising at least a first part and at least a second part, said first part being covered by an amorphous silicon layer (2) and a gate dielectric stack, thereby defining a first area, said second part being covered with at least one insulating layer (1) thereby defining a second area. The substrate can be a partly processed or a pristine wafer or slice of a semi-conductive material, like Si or GaAs or Ge or SiGe. Particularly, in case said substrate is a partly processed wafer or slice; at least a part of the active and/or passive devices can already be formed. In the example, the thickness of the amorphous silicon is typically in the range from 150 nm to 200 nm, particularly 200 nm, while the thickness of the oxide layer is typically in the range from 2 nm to 6 nm, particularly 4 nm. The invention is not limited however to the precise materials, thickness, conditions, etch recipes and etch tool, used in this example, but extends to all equivalents imaginable to a person skilled in the art. Said method comprises the step of:

a) forming a second and b) a third insulating layer on said first and said second area, said second insulating layer being an oxide layer with a thickness typically in the range from 5 nm to 20 nm, said third insulating layer being a nitride layer with a thickness typically in the range from 10 nm to 30 nm. In the example, the oxide layer comprises two sub-layers, a first oxide sub-layer with a thickness of about 4 nm being grown by re-oxidation (3) and a second oxide sub-layer, i.e. a TEOS layer (4), with a thickness of about 15 nm. The nitride layer (5) has a thickness of 20 nm. The substrate is a silicon wafer, in particular a wafer with a diameter of 150 mm. In general, the first, the second and the third insulating layer can be selected from the group of oxides, nitrides, oxynitrides and amorphous hydrogenated silicon carbide, provided that the disposable layer can be etched selectively to the third insulating layer and that the third insulating layer can be etched selectively to the disposable layer and the second insulating layer. According to this embodiment of the invention, the method further comprises the step of:

c) forming a disposable layer on said third insulating layer. In this example, the disposable layer is an amorphous silicon layer (6) with a thickness of about 70 nm. Alternatively also a polysilicon layer can be used. Prior to the introduction of the substrate in a chamber of an etch tool wherein the removal process is performed, by handling the substrate in an ambient comprising oxygen, a native oxide can be formed on said disposable layer. Possibly also a patterned resist layer can be formed on said disposable layer, with or without said native oxide, to serve as an etch mask during the etch process of the disposable layer. According to this example, the substrate, as depicted in FIG. 1a), i.e. with a native oxide layer (7) on top and without a patterned resist layer, is introduced in an etch tool. In a more preferred embodiment, this etch tool is the TCP9400SE Plasma Etch system from Lam Research. This system has the following characteristics:

Low Pressure-High Density
RF-Powered Top TCP Coil for Plasma Generation
RF-Powered Bottom Electrode
100% Anisotropic Etch
Electrostatic Chuck According to this embodiment of the invention, the method further comprises the steps (FIG. 1b)) of:

d.1) removing said native oxide;

d.2) anisotropically etching said disposable layer to thereby form at least one spacer (8) of said disposable layer on said second area adjacent to said first area. Particularly, in the example, this removal step d.1) is performed by a dry etching step in said chamber of said etch tool in an ambient comprising HBr and $Cl_2$ at a low pressure of 7 mTorr. Then, without breaking vacuum, the next removal step d.2) is performed, i.e. a dry etching step in an ambient, comprising HBr, $Cl_2$ and a mixture of oxygen and helium, at a low pressure of 12 mTorr, and the spacers of the disposable layer are defined. To define the spacers of the disposable layer, i.e. the amorphous silicon spacers, besides the HBr based etch recipe as used in the example, also other etch recipes can be used, provided that a number of conditions are met, like:

At first, in order to perform the amorphous silicon spacer definition accurately and reproducibly, the etch step, i.e. step d.2), that defines the spacer can be halted automatically. This is achieved by the end point triggering algorithm. Alternatively, this etch step d.2) can also be a timed etch step. End point triggering is based on the detection of an emission signal, i.e. the spectral variation that occurs when going from one layer to another. However, accurate end point triggering is only possible if an adequate stopping-layer is present. Examples of such stopping layers are oxides, nitrides and oxynitrides. To prevent etch-through of this stopping layer during the etch step a minimal thickness, typically a thickness of about 5 nm, is required.

At second, an automatic end point triggering is only useful if the etch rate of the etch step, i.e. step d.2), in this stopping layer is sufficiently low. In other words, the etch rate ratio of the amorphous silicon layer to the stopping layer has to be sufficiently high, i.e. typically higher than 3:1. In the example the stopping layer is a nitride layer. The etch rate ratio of amorphous silicon to nitride is about 7:1.

Further according to this embodiment of the invention, the method further comprises the step (see FIG. 1c)) of:

e) removing said third insulating layer, using said amorphous silicon spacer as a mask thereby forming L-shaped spacers (9) in said third insulating layer. Particularly, the amorphous silicon spacers defined in the previous etch step (step d.2)) can be used as an etch mask in this subsequent etch step. (step e)). According to the example, the third insulating layer is a nitride layer with a thickness of 15 nm. Step e), i.e. the nitride removal step, is performed after step d.2) without breaking vacuum. The complete sequence for the removal of the nitride layer (FIGS. 3 and 4.) uses an end point triggered step, i.e. step e.1), followed, again without breaking vacuum, by a five-second over-etch step, i.e. step e.2). Both dry etching steps e.1) and e.2) are performed in an ambient comprising HBr and $Cl_2$, at a low pressure of 7 mTorr. Because the etch process uses the second insulating layer, i.e. the oxide layer, as a stopping layer, the substrate will not be exposed to the etch process and therefore will not be damaged, i.e. etched, or contaminated.

The amorphous silicon spacers, being defined in step d), can be used as masking material for the subsequent nitride etch, or in general the third insulating layer etch, provided that a number of conditions are met like e.g.:

At first, a good dry etching chemistry for the removal of the third insulating layer has to be available. Particularly, when this third insulating layer is a nitride layer, several dry etch chemistries can be used like e.g. a carbon-fluorine based chemistry. According to this example, a HBr—$Cl_2$ based chemistry is used. In any case the dry etch chemistry has to be such that the etch rate ratio of said third insulating layer, i.e. nitride, to the disposable layer, i.e. amorphous silicon, is sufficiently high.

At second, in order to perform the etching of the third insulating layer, i.e. the nitride layer, accurately and reproducibly, the etch step, i.e. step e.1), can be halted automatically. This is achieved by the end point triggering algorithm. Alternatively, this etch step can be a timed etch step. However, accurate end point triggering is only possible if an adequate stopping-layer, i.e. the second insulating layer, is present. According to the example, said stopping layer is an oxide layer. To prevent etch-through of this stopping layer during the etch step a minimal thickness, e.g. about 5 nm, is required. Furthermore, an automatic end point triggering is only useful if the etch rate of the etch step, i.e. step e.1), in this stopping layer, i.e. the oxide layer, is sufficiently low. In other words, the etch rate ratio of the nitride layer to the oxide layer has to be sufficiently high, but this strongly depends on the thickness of the oxide layer. In the example, this etch rate ratio is 2:1.

Further according to this embodiment of the invention, the method further comprises the step of:

f) removing the spacer of the disposable layer (see FIG.1d)) to thereby free the spacer formed in said nitride layer. Preferably said nitride spacer is L-shaped. Steps d), e) and f) are performed subsequently in a chamber of an etch tool without breaking vacuum. The removal of the remaining of the disposable layer, i.e. the amorphous silicon layer, is a dry etching step performed in an ambient, comprising HBr, He and a mixture of He and oxygen, at a low pressure of 40 mTorr. The choice of the dry etch chemistry has to be based on a number of conditions like e.g.:

At first, the etch selectivity of the disposable layer to oxide and nitride is important because the aim of this etch step, i.e. step f) is to remove the amorphous silicon residues without attacking the oxide and nitride layers. Therefore an etch step is to be used which has a high selectivity towards the mentioned layers.

At second, it is evident that no amorphous silicon residues may be left after the complete removal process. Therefore a long etch time may be required. Particularly in case the disposable layer is a polysilicon layer, calculations reveal that a minimal time to remove the polysilicon spacer is 150 seconds. When applying a 100% over-etch time, the total etch time adds up to 300 seconds. Using this long total etch time no more polysilicon residues are observed.

As can be seen in FIG. 1d), the gate structure with self-aligned L-shaped insulating spacers is now defined. The distance, $d_2$, being the sum of the width of the second insulating layer conformal to the side wall of the first region, i.e. the gate, and the width of the second portion of the insulating spacer, can be easily varied by varying the thickness of the second and/or the third insulating layer. Particularly, the gate overlap can be optimised by fine tuning $d_2$. Furthermore the width of the first portion of the insulating spacer, $d_1$, can also be varied independently by changing the thickness of the disposable layer. Particularly, $d_1$ can determine the width of the extension region and/or can be an important parameter to assure a well-defined gate overlap. Moreover, the thickness, $t_1$, being at least the sum of the thickness of the first portion of the insulating spacer and the thickness of the insulating layers between said first portion and the underlying substrate, i.e. the second insulating layer or the first and the second insulating layer, can also easily be controlled by changing the thickness of the layer. Particularly, dependent on the implantation conditions, $t_1$ can be chosen such that the implantation is masked by the spacer or slowed down by the spacer, i.e. the penetration depth is changed, or partially blocked by the spacer, i.e. the implantation dose is lowered. Therefore, dependent on the desired device performance, an insulating spacer with the optimum dimensions can be formed to meet the performance specifications.

Further according to this embodiment of the invention, the method further comprises the step of (see FIG. 1e))

g) performing an ion implantation to form source/drain contact regions with highly doped extensions and to simultaneously dope the gate. According to the example, $t_1$, is tuned such that the penetration depth in the substrate of source/drain implantation is lowered by the insulating spacer and the underlying insulating layer. By doing so, not only highly doped source/drain regions (10) are created adjacent to the spacer, but also ultra shallow highly doped extensions (11) are created underneath the spacer because substantially the complete implantation dose penetrates into the substrate below the first portion of the insulating spacer, i.e. at least below the part of said first portion of the insulating spacer which is not covered by the second portion of the insulating spacer. According to the example, for the formation of 0.18 µm n-channel devices As is implanted with an energy of about 70 keV and a dose of about $4 \times 10^{15}$ cm$^{-2}$, while for the formation of 0.18 µm p-channel devices $BF_2$ is implanted with an energy of about 20 keV and a dose of about $4 \times 10^{15}$ cm$^{-2}$.

According to the method of the present invention the gate overlap can be kept very small and well defined by tuning $d_2$ (and $t_1$). Particularly, this can be of importance for sub 0.25 µm devices. Because of the reduced supply voltage, i.e. below 2.5 V, hot-carrier degradation is not necessarily an issue and therefore LDD FET's are no longer required. A far more important issue for these small devices is a good control of the channel region, the gate overlap and a low on-resistance. Preferably such devices are fabricated with a reduced number of thermal steps at reduced temperature. The method of the present invention allows for ultra-shallow self-aligned highly doped extensions adjacent to the gate and therefore a good gate overlap can be defined with a limited thermal budget. This thermal budget can even be more limited in case one opts to perform an additional source/drain contact implantation after step d), i.e. after the formation of the disposable spacer, using the disposable spacer as a mask, followed by a thermal treatment. By doing so, the source/drain contact regions are already formed and simultaneously in case a polysilicon or amorphous silicon gate is used, also the gate is doped. As a consequence the major part of the thermal treatments which define the active regions can be performed prior to the formation of the extensions (step g)). Examples of such steps are anneal steps and dope activation steps. For instance, to diffuse As in the gate to avoid gate depletion effects in the n-type doped, i.e. As, gate of a ntype FET, a typical thermal treatment is 20 minutes at 900 degrees C in a conventional furnace. After the formation of the extensions according to step g), only a very short anneal step (and simultaneous dope activation step) is performed which minimizes the gate overlap and is beneficial for the process control and reproducibility. For instance this anneal step can be a very short rapid thermal processing step. For instance one can opt one single thermal step, both for the n-type FET and the p-type FET, being e.g. 10 seconds at 1030 degrees C. Alternatively one can opt for a split approach wherein first the n-type doped source/drain extensions are implanted and annealed using e.g. a thermal treatment of 10 seconds at 1030 degrees C, and thereafter the p-type extensions of the p-type FET are implanted and annealed using e.g. a thermal treatment of 10 seconds at 900 degrees C.

In another embodiment of the invention, prior to the implantation step (step g)) the method further comprises the step of:

removing said first and said second insulating layer, using said insulating spacer formed in said third insulating layer as a mask. At least the final step of this removal process has to be highly selective to the underlying substrate and has to avoid damaging the substrate, therefore, preferably, this step is a wet etching step. Alternatively this removal step can also be performed after the source/drain regions are formed.

In another embodiment of the invention, the method can further comprise the step of:

h) forming a sacrificial silicon layer on the exposed areas of the substrate, i.e. the source/drain regions. In a subsequent silicidation process, this silicon layer can be consumed to form a highly conductive silicide layer contacting the source/drain regions. By doing so the underlying silicon substrate is not affected, or less affected dependent on the thickness of the sacrificial silicon layer, by the silicidation. Consequently the source/drain junctions can be shallower. Moreover, such a sacrificial silicon layer can be beneficial to remove the silicide thickness dependence on doping type and density. Preferably this sacrificial silicon layer is a uniformly and lightly doped layer which is formed by selective epitaxial growth. Furthermore, such a layer can be grown simultaneously on the gate as well.

What is claimed is:

1. A method for fabricating a field effect transistor on a substrate, said substrate comprising at least one first part and at least one second part adjacent to said first part, said first part being covered with at least one first insulating layer and at least one conductive layer thereby forming a first area, said second part being either uncovered or covered with said first insulating layer, thereby forming a second area, said method comprising the steps of:

a) forming a second insulating layer on said first and said second areas, at least when said second part of said substrate is uncovered;

b) forming a third insulating layer on said second insulating layer or on said first and second area;

c) forming a disposable layer on said third insulating layer;

d) anisotropically etching said disposable layer using said third insulating layer as an etch stop layer to thereby form at least one spacer of said disposable layer on said second area adjacent to said first area;

e) removing said third insulating layer, using said spacer of said disposable layer as a mask;

f) removing said spacer of said disposable layer to thereby free the insulating spacer formed in said third insulating layer, said insulating spacer comprising a first portion, being the base of said spacer, and a second portion, being the upright part of the insulating spacer adjacent to said first area; and g) performing an implantation to simultaneously form highly doped source/drain contact regions adjacent to the insulating spacer and shallow highly doped extension regions underneath the insulating spacer, wherein said first portion of said insulating spacer is used as an element to lower the penetration depth of said implantation into the substrate thereby assuring that substantially the entire implantation dose penetrates at least into the part of the substrate below said first portion of said spacer.

2. A method as in claim 1, wherein said disposable layer is selected from the group consisting of a polysilicon layer, an amorphous silicon layer and a silicon (di)oxide layer.

3. A method as in claim 1, wherein said first, said second and said third insulating layer are selected from the group consisting of nitrides, oxides and oxynitrides.

4. A method as in claim 1, wherein after said spacer of said disposable layer is formed (step d)), a source/drain contact implantation is performed using said spacer of said disposable layer as a mask to thereby define at least source/drain contact regions in said second part of said substrate.

5. A method as in claim 4, wherein said conductive layer of said first area is a polysilicon layer or an amorphous silicon layer.

6. A method as in claim 5, wherein said polysilicon layer of said first area is doped by said source/drain contact implantation.

7. A method as in claim 6, wherein said source/drain contact implantation is followed by a thermal step.

8. The method of claim 1, wherein said method further comprises the step of:
performing an anneal of the substrate, wherein said step is conducted after step g).

9. The method of claim 8, wherein said anneal is conducted at a temperature ranging from about 900° C. to about 1030° C. for a period of time ranging from about 10 seconds to twenty minutes.

10. The method of claim 1, wherein said implantation is an n-type doped source/drain implantation.

11. The method of claim 1, wherein said method further comprises the step of:
forming a sacrificial silicon layer on an exposed area of the substrate, wherein said step is performed after step g).

12. The method of claim 11, wherein said method further comprises the step of:
performing a silicidation process wherein said silicon layer is consumed to form a highly conductive silicide layer contacting the source/drain regions.

13. The method of claim 11, wherein said silicon layer is a uniformly and lightly doped layer formed by selective epitaxial growth.

14. The method of claim 11, wherein said method further comprises the step of:
forming a sacrificial silicon layer on a gate.

15. The method of claim 1, wherein said method further comprises the step of:
implanting a source/drain region, wherein said step is performed after step d).

16. The method of claim 15, wherein said implanting step is n-type implanting.

17. The method of claim 1, wherein said method further comprises the step of:
annealing the substrate, wherein said step is performed after step g).

18. A method for fabricating a field effect transistor on a substrate, said substrate comprising at least one first part and at least one second part adjacent to said first part, said first part being covered with at least one first oxide layer and at least one conductive layer thereby forming a first area, said second part being either uncovered or covered with said first oxide layer, thereby forming a second area, said method comprising the steps of:
forming a second oxide layer on said first and said second area, at least when said second part of said substrate is uncovered;
forming a nitride layer on said second oxide layer or on said first and second area;
forming a disposable oxide layer on said nitride layer; anisotropically etching said disposable oxide layer using said nitride layer as an etch stop layer to thereby form at least one spacer of said disposable oxide layer on said second area adjacent to said first area;

removing said nitride layer, using said spacer of said disposable layer as a mask to thereby define an insulating spacer in said nitride layer, said insulating spacer comprising a first portion, being the base of said spacer, and a second portion, being the upright part of the insulating spacer adjacent to said first area;

removing said spacer of said disposable oxide layer and said first and second oxide layer using said insulating spacer as a mask; and performing an implantation to simultaneously form highly doped source/drain contact regions adjacent to the insulating spacer and shallow highly doped extension regions underneath the insulating spacer, wherein said first portion of said insulating spacer is used as an element to lower the penetration depth of said implantation into the substrate thereby assuring that substantially the entire implantation dose penetrates at least into the part of the substrate below said first portion of said spacer.

19. A method as in claim 18, wherein the step of removing said spacer of said disposable oxide layer and said first and second oxide layer using said insulating spacer as a mask, is executed using a HF-based etch solution.

20. A method for fabricating a field effect transistor on a substrate, said substrate comprising at least one first part and at least one second part adjacent to said first part, said first part being covered with at least one first insulating layer and at least one conductive layer thereby forming a first area, said second part being either uncovered or covered with said first insulating layer, thereby forming a second area, said method comprising the steps of:
a) forming a second insulating layer on said first and said second areas, at least when said second part of said substrate is uncovered;
b) forming a third insulating layer on said second insulating layer or on said first and second area;
c) forming a disposable layer on said third insulating layer;
d) anisotropically etching said disposable layer using said third insulating layer as an etch stop layer to thereby form at least one spacer of said disposable layer on said second area adjacent to said first area;
e) removing said third insulating layer, using said spacer of said disposable layer as a mask;
f) removing said spacer of said disposable layer to thereby free the insulating spacer formed in said third insulating layer, said insulating spacer comprising a first portion, being the base of said spacer, and a second portion, being the upright part of the insulating spacer adjacent to said first area;
g) performing an n-type doped source/drain implantation to simultaneously form highly doped source/drain contact regions adjacent to the insulating spacer and shallow highly doped extension regions underneath the insulating spacer, wherein said first portion of said insulating spacer is used as an element to lower the penetration depth of said implantation into the substrate thereby assuring that substantially the entire implantation dose penetrates at least into the part of the substrate below said first portion of said spacer; and
h) performing an additional p-type source/drain implantation, wherein said step is conducted after step g).

21. The method of claim 20, wherein said method further comprises the step of:

performing an anneal at a temperature of about 1030° C. for about 10 seconds, wherein said step is performed after step g) and before step h).

22. The method of claim 20, wherein said method further comprises the step of:
performing an anneal at a temperature of about 900° C. for about 10 seconds, wherein said step is performed after step h).

23. The method of claim 20, wherein the second insulating layer comprises an oxide layer.

24. The method of claim 20, wherein the third insulating layer comprises a nitride layer.

25. A method for fabricating a field effect transistor on a substrate, said substrate comprising at least one first part and at least one second part adjacent to said first part, said first part being covered with at least one first insulating layer and at least one conductive layer thereby forming a first area, said second part being either uncovered or covered with said first insulating layer, thereby forming a second area, said method comprising the steps of:
  a) forming a second insulating layer on said first and said second areas, at least when said second part of said substrate is uncovered;
  b) forming a third insulating layer on said second insulating layer or on said first and second area;
  c) forming a disposable layer on said third insulating layer;
  d) anisotropically etching said disposable layer using said third insulating layer as an etch stop layer to thereby form at least one spacer of said disposable layer on said second area adjacent to said first area;
  e) removing said third insulating layer, using said spacer of said disposable layer as a mask;
  f) removing said spacer of said disposable layer to thereby free the insulating spacer formed in said third insulating layer, said insulating spacer comprising a first portion, being the base of said spacer, and a second portion, being the upright part of the insulating spacer adjacent to said first area; and
  g) performing an implantation to simultaneously form highly doped source/drain contact regions adjacent to the insulating spacer and shallow highly doped extension regions underneath the insulating spacer, wherein said first portion of said insulating spacer is used as an element to lower the penetration depth of said implantation into the substrate thereby assuring that substantially the entire implantation dose penetrates at least into the part of the substrate below said first portion of said spacer, wherein a distance corresponding to an offset to the source/drain region is a distance equal to the sum of the width of the second insulating layer conformal to a side wall of the first region and the width of the second portion of the insulating spacer.

26. A method for fabricating a field effect transistor on a substrate, said substrate comprising at least one first part and at least one second part adjacent to said first part, said first part being covered with at least one first insulating layer and at least one conductive layer thereby forming a first area, said second part being either uncovered or covered with said first insulating layer, thereby forming a second area, said method comprising the steps of:
  a) forming a second insulating layer on said first and said second areas, at least when said second part of said substrate is uncovered;
  b) forming a third insulating layer on said second insulating layer or on said first and second area;
  c) forming a disposable layer on said third insulating layer;
  d) anisotropically etching said disposable layer using said third insulating layer as an etch stop layer to thereby form at least one spacer of said disposable layer on said second area adjacent to said first area;
  e) removing said third insulating layer, using said spacer of said disposable layer as a mask;
  f) removing said spacer of said disposable layer to thereby free the insulating spacer formed in said third insulating layer, said insulating spacer comprising a first portion, being the base of said spacer, and a second portion, being the upright part of the insulating spacer adjacent to said first area; and
  g) performing an implantation to simultaneously form highly doped source/drain contact regions adjacent to the insulating spacer and shallow highly doped extension regions underneath the insulating spacer, wherein said first portion of said insulating spacer is used as an element to lower the penetration depth of said implantation into the substrate thereby assuring that substantially the entire implantation dose penetrates at least into the part of the substrate below said first portion of said spacer, wherein a distance corresponding to an offset to the extension region is a distance equal to the width of the second insulating layer conformal to a side wall of the first region and the width of the second portion of the insulating spacer.

27. A method for fabricating a field effect transistor on a substrate, said substrate comprising at least one first part and at least one second part adjacent to said first part, said first part being covered with at least one first insulating layer and at least one conductive layer thereby forming a first area, said second part being either uncovered or covered with said first insulating layer, thereby forming a second area, said method comprising the steps of:
  a) forming a second insulating layer on said first and said second areas, at least when said second part of said substrate is uncovered:
  b) forming a third insulating layer on said second insulating layer or on said first and second area;
  c) forming a disposable layer on said third insulating layer;
  d) anisotropically etching said disposable layer using said third insulating layer as an etch stop layer to thereby form at least one spacer of said disposable layer on said second area adjacent to said first area:
  e) removing said third insulating layer, using said spacer of said disposable layer as a mask;
  f) removing said spacer of said disposable layer to thereby free the insulating spacer formed in said third insulating layer, said insulating spacer comprising a first portion, being the base of said spacer, and a second portion, being the upright part of the insulating spacer adjacent to said first area; and
  g) performing an implantation to simultaneously form highly doped source/drain contact regions adjacent to the insulating spacer and shallow highly doped extension regions underneath the insulating spacer, wherein said first portion of said insulating spacer is used as an element to lower the penetration depth of said implantation into the substrate thereby assuring that substantially the entire implantation dose penetrates at least into the part of the substrate below said first portion of said spacer;

h) annealing the substrate, wherein said step is performed after step g); and i) implanting a p-type source/drain, wherein said implanting step is performed after said annealing step.

28. The method of claim 27, wherein said method further comprises the step of:

performing an additional anneal, wherein said anneal is performed after said step of implanting a p-type source/drain.

* * * * *